United States Patent [19]
Molenbroek et al.

[11] Patent Number: 6,124,186
[45] Date of Patent: Sep. 26, 2000

[54] DEPOSITION OF DEVICE QUALITY, LOW HYDROGEN CONTENT, HYDROGENATED AMORPHOUS SILICON AT HIGH DEPOSITION RATES WITH INCREASED STABILITY USING THE HOT WIRE FILAMENT TECHNIQUE

[75] Inventors: Edith C. Molenbroek, Utrecht, Netherlands; Archie Harvin Mahan, Golden; Alan C. Gallagher, Louisville, both of Colo.

[73] Assignee: Midwest Research Institute, Kansas City, Mo.

[21] Appl. No.: 09/066,276

[22] Filed: Apr. 24, 1998

Related U.S. Application Data

[63] Continuation of application No. 08/755,947, Nov. 25, 1996, abandoned, which is a continuation-in-part of application No. 08/721,080, Sep. 26, 1996, abandoned, which is a continuation-in-part of application No. 08/222,720, May 25, 1994, Pat. No. 5,776,819, which is a continuation-in-part of application No. 07/878,585, May 5, 1992, abandoned.

[51] Int. Cl.$^7$ .................................................. H01L 2/203
[52] U.S. Cl. .......................... 438/482; 438/485; 427/99; 148/DIG. 1
[58] Field of Search ................. 148/DIG. 1; 427/99; 438/482, 485

[56] References Cited

U.S. PATENT DOCUMENTS

| | | | |
|---|---|---|---|
| 4,237,150 | 12/1980 | Wiesmann | 427/74 |
| 4,237,151 | 12/1980 | Strongin et al. | 427/74 |
| 4,459,163 | 7/1984 | Macdiarmid et al. | 148/174 |
| 4,485,128 | 11/1984 | Dalal et al. | 427/85 |
| 4,634,605 | 1/1987 | Wiesmann | 427/249 |
| 4,702,965 | 10/1987 | Fang | 428/457 |
| 4,749,588 | 6/1988 | Fukuda et al. | 427/39 |
| 4,810,526 | 3/1989 | Ito et al. | 427/50 |
| 4,839,701 | 6/1989 | Imagawa et al. | 357/2 |
| 5,151,383 | 9/1992 | Meyerson et al. | 437/101 |
| 5,397,737 | 3/1995 | Mahan et al. | 437/101 |

FOREIGN PATENT DOCUMENTS 3-187215  8/1991  Japan.

OTHER PUBLICATIONS

"Amorphous Semiconducting Silicon–Hydrogen Alloys," H. Fritzsche, C.C. Tsai, and P. Persans, Solid State Technology, pp. 55–60, dated.

"Deposition of a–Si:H by Homogeneous CVD," B.A. Scott, R.M. Plecenik, and E.E. Simonyi, Journal de Physique, vol. C4, pp. 635–638.

A Review of the Structure, Properties and Applications of Hydrogenated Amorphous Silicon, Z. Smith, 1983.

"Deposition of Device Quality, Low H Content Amorphous Silicon," A.H. Mahan, J. Carapella, B.P. Nelson and R.S. Crandall.

Primary Examiner—Tuan H. Nguyen
Assistant Examiner—Matthew Whipple
Attorney, Agent, or Firm—Ken Richardson; Paul J. White

[57] ABSTRACT

A method or producing hydrogenated amorphous silicon on a substrate, comprising the steps of: positioning the substrate in a deposition chamber at a distance of about 0.5 to 3.0 cm from a heatable filament in the deposition chamber; maintaining a pressure in said deposition chamber in the range of about 10 to 100 millitorr and pressure times substrate-filament spacing in the range of about 10 to 100 millitorr-cm, heating the filament to a temperature in the range of about 1,500 to 2,000° C., and heating the substrate to a surface temperature in the range of about 280 to 475° C.; and flowing silicohydride gas into the deposition chamber with said heated filament, decomposing said silicohydride gas into silicon and hydrogen atomic species and allowing products of gas reactions between said atomic species and the silicohydride gas to migrate to and deposit on said substrate while adjusting and maintaining said pressure times substrate-filament spacing in said deposition chamber at a value in said 10 to 100 millitorr range to produce statistically about 3 to 50 atomic collisions between the silicon and hydrogen atomic species migrating to said substrate and undecomposed molecules of the silane or other silicohydride gas in the deposition chamber.

16 Claims, 9 Drawing Sheets

DEPOSITION OF DEVICE QUALITY, LOW HYDROGEN CONTENT, HYDROGENATED AMORPHOUS SILICON AT HIGH DEPOSITION RATES WITH INCREASED STABILITY USING THE HOT WIRE FILAMENT TECHNIQUE

CROSS-REFERENCE TO RELATED PATENT APPLICATIONS

The patent application is a continuation of U.S. patent application Ser. No. 08/755,947, filed on Nov. 25, 1996, now abandoned which is a continuation-in-part of U.S. patent application Ser. No. 08/721,080, filed Sep. 26, 1996, abandoned, which is a continuation-in-part of U.S. application Ser. No. 08/222,720, filed May 25, 1994, now U.S. Pat. No. 5,776,819 filed on May 25, 1994, which is a continuation-in-part of U.S. patent application Ser. No. 07/878,585, filed on May 5, 1992, abandoned.

CONTRACTUAL ORIGIN OF THE INVENTION

The United States Government has rights in this invention under Contract No. DE-AC36-83CH10093 between the U.S. Department of Energy and the National Renewable Energy Laboratory, a Division of Midwest Research Institute.

BACKGROUND OF THE INVENTION

1. Field of the Invention

The present invention relates to the deposition of thin films of material on a substrate, and more specifically to the high-rate deposition of device quality hydrogenated amorphous silicon (a-Si:H) by the hot wire technique for use as photovoltaic and other semiconducting devices.

2. Description of the Prior Art

In the manufacture and construction of microelectronic semiconductor devices and photovoltaic solar cells, amorphous silicon is a feasible alternative to the use of silicon crystals for layers of a device, due to economics, flexibility in manufacture, and higher through-put. However, unalloyed amorphous silicon has a very high density of midgap (defect) states, and, as a consequence, has very poor electrical properties. Most of these midgap defect states can be passivated by the incorporation of hydrogen into the amorphous silicon layer, which is usually accomplished during the deposition process, and it considerably improves the electrical properties of the individual layers and the device.

Two measures of these electrical properties of hydrogenated amorphous silicon layers are the Urbach tail width and the density of midgap states, both of which should be minimized to achieve device quality semiconductor films. Although exact mechanisms are not known, there is a relationship in glow discharge (GD) deposited films between the amount of hydrogen incorporated and both the Urbach tail width and density of midgap states. At hydrogen concentrations too low, the amorphous silicon film exhibits very poor electrical properties due to the high density of midgap states and is thus not suitable for use in practical devices. At hydrogen concentrations too high, these films show an increased density of microvoids and once again inferior electrical properties.

A pervasive problem when hydrogenated amorphous silicon is used in photovoltaic solar cells has been that these solar cells tend to degrade electrically over time upon exposure to sunlight. This degradation, which is referred to as the Staebler-Wronski effect, has been linked to the concentration of hydrogen within the amorphous silicon film. The prevalent model for the Staebler-Wronski effect has suggested that the degradation is due to movement of hydrogen within the film. Therefore, until recently, hydrogen content in the range of 10–15 at. % was considered to be an optimum balance, i.e., not so low as to cause inferior electrical device qualities and not so high as to be subject to excessive Staebler-Wronski degradation upon exposure to sunlight.

In the last decade or so, since the development of the glow discharge (GD) technique as the standard means for producing device quality hydrogenated amorphous silicon (a-Si:H) films for solar cells and other applications, there has been considerable progress made in increasing the efficiencies of these solar cells. However, most of this progress has been in improved techniques in manufacturing and design of these multi-layer solar cells, and not improvements in the electrical quality of the a-Si:H layer. Examples of such improvements include better uniformity of deposition, better light capture, and better doping of layers. The U.S. Pat. No. 4,237,150, issued to H. Weismann, and the U.S. Pat. No. 4,237,151, issued to Strongin et al. illustrate attempts to improve amorphous silicon as a photovoltaic material by using silane as a silicon source gas in a hot wire deposition technique to eliminate impurities, non-uniformities, and clusters of silicon that they thought limited the utility of the material. J. Doyle et al., in their article, *Production of High Quality Amorphous Silicon Films by Evaporative Silane Surface Decomposition,* published in the Journal of Applied Physics, Vol. 64, p. 3215–3223, 1988, gave credit to H. Weismann and carried the improvements to better temperature and vacuum ranges, but they apparently were not able to control the degradation from the Staebler-Wronski effect. No improvements beyond that available using glow discharge (GD), either in the material quality or in the Staebler-Wronski effect, were achieved by using the deposition methods that were reported in those publications.

The U.S. Pat. No. 5,397,737 issued to Mahan et al., which is incorporated herein by reference, shows that by keeping four deposition parameters in the hot wire technique—filament temperature, silane pressure, distance between filament and substrate, and substrate temperature—all within certain specified ranges, hydrogenated amorphous silicon (a-Si:H) films with hydrogen content as low as 1 at. % can be produced that still have device quality electrical properties. Such low hydrogen content, device quality films were also shown to have substantially less Staebler-Wronski degradation when exposed to sun light than the previous state-of-the-art, device quality hydrogenated amorphous silicon (a-Si:H) films with 10–15 at. % hydrogen content.

The improvement described above, as well as many other improvements made in device quality hydrogenated amorphous silicon (a-Si:H) films, have advanced the state-of-the-art in electrical quality. However, to maintain such electrical device quality, the deposition rates of the hydrogenated amorphous silicon films have had to remain quite low. For example, the deposition rate for the low hydrogen content, device quality hydrogenated amorphous silicon (a-Si:H) film produced according to the U.S. Pat. No. 5,397,737 discussed above, is in the range of about 5–10 Å/sec. In general, past experiences in this field have indicated that as deposition rates are increased, the electrical qualities of the resulting hydrogenated amorphous silicon film devices decrease. To maintain device quality, current industrial GD production of hydrogenated amorphous silicon cells is done at deposition rates of 1–2 Å/sec. One reason for using such low deposition rate is believed to be that, as the deposition rate increases, the rate of arrival and incorporation of hydrogen atoms into the a-Si:H compound is faster than the out-diffusion of hydrogen atoms that accompanies Si—Si bonding. In addition, beyond a certain hydrogen content in terms of atomic percent (at. %), this excess hydrogen bonds differently. Instead of monohydride silicon bonds (SiH), which provide effective defect passivation and have good electrical qualities and stability, polyhydride bonds $(SiH_2)_n$ begin to form, which are less desirable, remain in the film. Also, at higher deposition rates, hydrogen that does not out-diffuse does not have time to diffuse to preferred sites, thereby forming a dense silicon network. Therefore, the presence of polyhydrides $(SiH_2)_n$ result in less dense films with more microvoids, inferior electrical properties, poorer solar cell performance, and greater Staebler-Wronski effect degradation.

There would be significant advantages for higher deposition rates of hydrogenated amorphous silicon (a-Si:H) films, provided that the resulting films have device quality electrical characteristics and minimal Staebler-Wronski effect degradation upon exposure to sun light. In particular, deposition of the intrinsic (i) layer of device, which is commonly ten to twenty times thicker than the p-layer and the n-layer, could be accomplished with much less dwell time in the deposition chamber than is now required at current low deposition rates, thus allowing for higher through-put in manufacturing lines.

There are reports of attempts to achieve higher rate depositions of hydrogenated amorphous silicon films. For example: The Neuchatel Laboratory reported a VHF (very high frequency) glow discharge plasma deposition process in which frequencies varied from 13.56 MHz to 100 MHz to achieve deposition rates up to 20 Å/sec, F. Finger et al., MRS Symp. Pro., vol. 192, page 583 (1990); The Electrotechnical Laboratory has used an rf (radio frequency) deposition system in a chemical vapor deposition (with higher discharge powers and higher substrate temperatures) that deposited films at about 10 Å/sec, G. Ganguly et al., Phys. Rev. B., vol. 47, page 3661 (1993); and United Solar Systems Corp. has used a microwave deposition and higher substrate temperature to achieve up to 100 Å/sec, S. Guha et al., APL, vol. 66, page 595 (1995). However, hydrogenated amorphous silicon films produced by such high deposition rate techniques have not shown sufficient promise with regard to a combination of improved material properties and a reduced Staebler-Wronski degradation to warrant serious consideration for incorporation into industrial manufacturing processes.

SUMMARY OF THE INVENTION

Accordingly, an object of the present invention is to provide a high deposition rate process for producing hydrogenated amorphous silicon film which has state-of-the-art or better electrical device quality of the intrinsic or undoped material.

Another object of the present invention is to provide a viable, economical, and high through-put method of depositing hydrogenated amorphous silicon films for solar cells and other applications, which films demonstrate significantly improved electrical, chemical, and structural qualities that meet specification for use as commercial solar cell devices.

Additional objects, advantages, and novel features of the invention shall be set forth in part in the description that follows, and in part will become apparent to those skilled in the art upon examination of the following or may be learned by the practice of the invention. The objects and the advantages of the invention may be realized and attained by means of the instrumentalities and in combinations particularly pointed out in the appended claims.

To achieve the foregoing and other objects and in accordance with the purpose of the present invention, as embodied and broadly described herein, the method of this invention may comprise producing a thin film of hydrogenated amorphous silicon by flowing a silicohydride gas past a filament which has been heated to a sufficient temperature to thermally decompose the silicohydride on the filament into mostly, atomic silicon and atomic hydrogen. The filament should be heated to at least 1500° C., but is preferably heated to about 2,000° C. This gaseous mixture of mostly atomic silicon and atomic hydrogen is then evaporated from the filament and products of reactions of the silicon and hydrogen atoms with silicohydride gas molecules are deposited on to a substrate heated to between 200° C. and 600° C., but which is preferably heated to about 425° C. (actual substrate surface temperature) for concentrated silane. This procedure of thermally decomposing the silicohydride on the heated filament, allowing the atomic Si and H to react with the silicohydride gas, and then depositing these reaction products onto a heated substrate occurs within a deposition chamber maintained at an optimum multiplication product of pressure (P) times filament-substrate spacing (L) in the range of about 10–100 millitorr-cm, preferably about 30 to 60 millitorr-cm for concentrated silane, and with the substrate positioned within a range of about 0.5–3.0 cm, preferably about 1.5 cm, from the filament. An array of a plurality of filaments, each of which is positioned L distance from the substrate as well as being spaced by a distance approximately equal to L apart from each other, can be used to yield uniform a-Si:H film thickness over a large substrate area.

The silicohydride gas may be silane, disilane, or other gases or combinations of gases containing silicon and hydrogen. The heated filaments are preferably made from tungsten, but can be made from other high temperature materials such as tantalum, graphite, or silicon carbide so long as the filament temperature is adjusted to decompose the silicohydride gas and release H atoms efficiently. When the silicohydride gas is decomposed at those temperature and pressure ranges described above, the hydrogen content of the film appears to be controlled by the temperature of the substrate and the deposition rate, such that the higher the temperature or the lower the deposition rate, the lower the hydrogen content. Despite high deposition rates of about 50 Å/sec (nominally in the range of 15–50 Å/sec), films produced at high substrate temperatures ($T_s$) with concentrated silane in the process of this invention still exhibit photovoltaic device quality electrical, chemical, and mechanical properties which do not degrade as readily upon exposure to sunlight, even though the hydrogen content of the resulting hydrogenated amorphous silicon film is about 8 at. %. When using other silicohydride gases or mixtures of these gases, the P×L ranges described above should be adjusted to achieve equivalent probability of gas reaction with Si and H atoms from the gas decomposition that occurs at the filament.

BRIEF DESCRIPTION OF THE DRAWINGS

The accompanying drawings, which are incorporated herein and form a part of the specification illustrate preferred embodiments of the present invention, and together with the description, serve to explain the principles of the invention. In the drawings.

DETAILED DESCRIPTION OF THE PREFERRED EMBODIMENTS

A device quality hydrogenated amorphous silicon (a-Si:H) film is produced at high rates of about 50 Å/sec or more by the high temperature decomposition of a gas containing silicon and hydrogen, under a vacuum, by depositing the products of silicohydride gas reactions with silicon and hydrogen from decomposed silicohydride gas onto a heated substrate. Heretofore it has been believed that to achieve a device quality hydrogenated amorphous silicon film, as determined by measuring such parameters as Urbach Tail widths, Tauc's Bandgap, Photo-conductivity, and Dark Conductivity, that the film had to contain at least between 10 and 15 atomic percent (at. %) hydrogen and be produced at low rates of less than about 10 Å/sec and preferably as low as about 1–2 Å/sec. However, the hydrogenated amorphous silicon (a-Si:H) films produced from concentrated silane according to the principles and method of the present invention at higher rates of about 50 Å/sec or more with somewhat lower hydrogen content closer to about 8 at. % still exhibit superior device quality electrical characteristics and stability.

Figure 1:
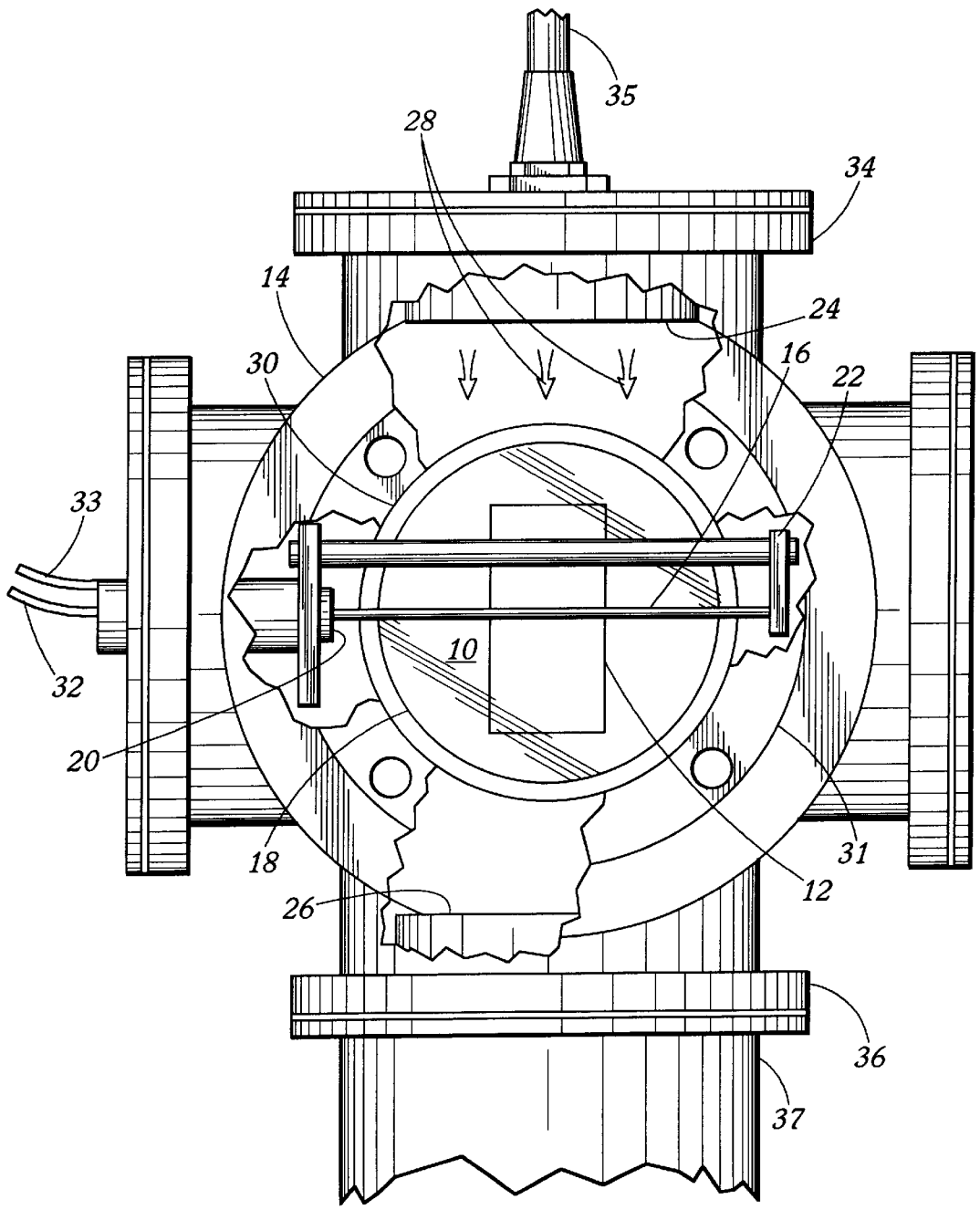
FIG. 1 is a top plan view of a hot filament chemical vapor deposition chamber suitable for producing the low hydrogen content, hydrogenated amorphous silicon film according to the principles of the present invention.

The hydrogenated amorphous silicon film may be produced at a high deposition rate according to this invention with any suitable apparatus as will be understood readily by persons skilled in the art upon gaining an understanding of the features of this invention. However, to facilitate the explanation of this invention, an example suitable apparatus is illustrated in FIG. 1. A typical deposition chamber 10 enclosed by a housing 14 is illustrated from a top plan view with a transparent window 30 mounted in the top flanged opening 31 and with portions of the housing 14 broken away to show the operative components in the chamber 10. A substrate table or holder 18 is positioned in the chamber 10 to support a substrate 12 on which the hydrogenated amorphous silicon film is to be deposited. A heating element (not shown) is provided under the substrate table 18, preferably outside the vacuum system, to heat the substrate 12 to the desired temperatures, which are described in more detail below. A wire filament 16, preferably tungsten, is supported between two electrodes 20, 22 a spaced distance over the substrate holder 18, and electric power is supplied to the electrodes 20, 22 by wire leads 32, 33. Because the distance between the filament 16 and the substrate 12 is a critical factor of this embodiment of the invention and because that distance is not large, it is preferred that the filament 16 be a straight, rather than coiled, wire configuration so that the distance between the filament 16 and the substrate 12 does not vary over the width of the substrate 12. For uniform deposition on a larger substrate surface, a plurality of filaments 16 can be mounted in spaced apart relation to each other over the substrate 12, as illustrated diagrammatically in FIG. 9. When such a plurality of filaments 16 are used, it is preferred that the distance M between filaments 16 be about the same as the distance L between the filament 16 and the substrate 12. Referring again to FIG. 1, a gas inlet 24 mounted in flange 34 is connected by a conduit 35 to a feed gas source (not shown), and an outlet port 26 mounted in the diametrically opposite flange 36 is connected by a conduit 37 to a vacuum pump (not shown).

In operation, the substrate 12 is placed on support table 18, and the chamber 10 is sealed. The vacuum pump (not shown) is turned on, and the chamber 10 is evacuated. A silicohydride gas, as will be described in more detail below, is made to flow into the chamber 10 through tube 35 and inlet 24, as indicated by arrows 28. The silicohydride gas flow across chamber 10 preferably transverse to the filament 16. When electric power is applied to the filament 16, it gets very hot, and the silicohydride gas is absorbed onto the hot filament 16 similar to a catalytic converter, where it is decomposed and re-evaporated substantially in the form of its atomic species—silicon and hydrogen. The silicon and hydrogen atoms then react with other silicohydride gas molecules to form radicals, which are then deposited onto the substrate, as will be described in more detail below.

There are four important identified deposition parameters that have to be optimized to produce good device quality films of hydrogenated amorphous silicon, according to this invention. These four parameters, all of which have to be coordinated and kept within the preferred ranges, include filament temperature, silicohydride gas pressure in the chamber, distance between filament and substrate, and substrate temperature, as will be described in more detail below. As will also be described in more detail below, the gas pressure and the distance between the filament and the substrate are preferably maintained within a balanced relationship defined by the mathematical product of these two parameters i.e., by multiplying the pressure P times the distance L (P×L).

The filament temperature at which the decomposition of the silicohydride gas begins will vary somewhat, depending on the specific silicohydride gas used, such as, for example, silane, disilane, or other gases or combinations of gases containing silicon and hydrogen. The preferred silicohydride gas is concentrated, high purity silane ($SiH_4$) from a resultant process and device quality perspective. From a safety perspective, however, it may be even more preferred to use a safer (helium-diluted) silane or "safe gas". Hydrogen-diluted silicohydride gas may also be used. The filament 16 temperature should be at least 1,500° C. and preferably 2,000° C. That temperature provides the most efficient and effective decomposition of the silane gas to its constituent elements—silicon and hydrogen. It also prevents build-up of Si atoms on the filament, which modifies the deposition behavior and shortens the filament life time. The flow of silane at a rate in the range of 10–100 sccm, preferably about 50 sccm for a 4-inch diameter chamber, can be regulated by a flow controller and is pumped through the chamber by means of a turbo-molecular pump. The temperatures at the ends of the filament 16 are usually not has high as in the center, and, where such end temperatures are less than 1,500° C., such as around 1,400° C., the silicon and possibly even the hydrogen, tend to alloy at those outer ends, which is an undesirable effect that should be kept to a minimum for the purposes of this invention.

Figure 9:
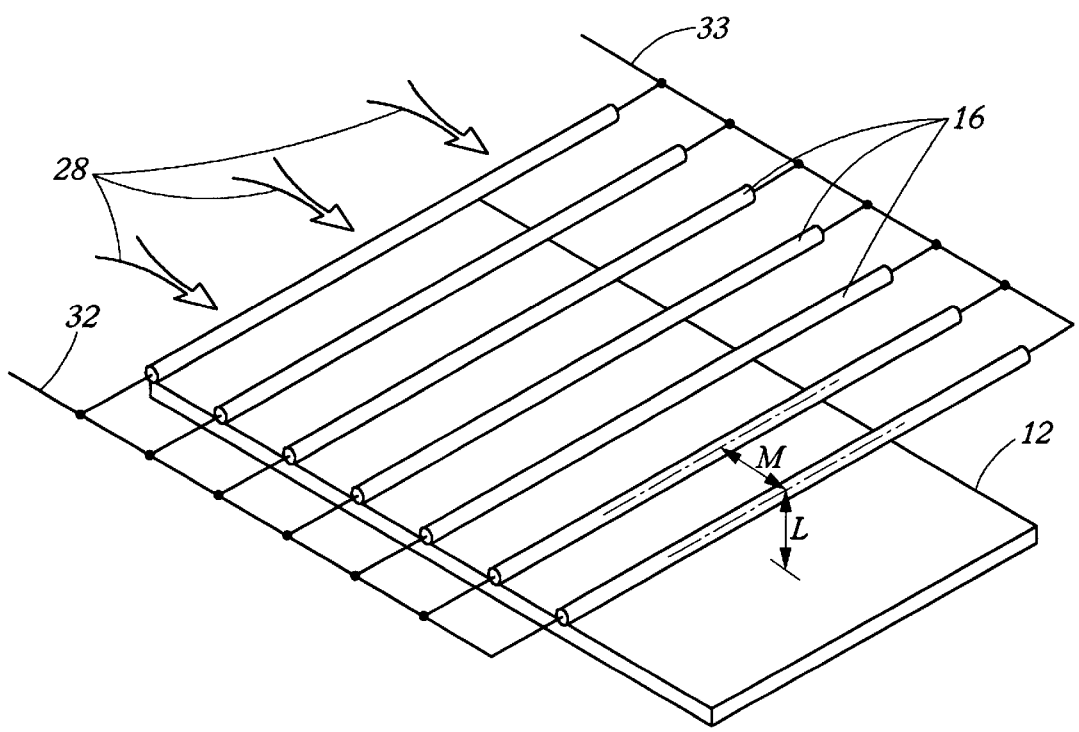
FIG. 9 is a diagrammatic isometric view of a multiple filament deposition apparatus for coating larger substrate surfaces according to this invention.

The second and third parameters, chamber pressure and distance between the filament 16 and substrate 12 are very interrelated. In the early research on amorphous silicon deposition using the hot wire filament technique, it was found that as the decomposed silicon and hydrogen atomic species are evaporated off the hot filament 16 and migrate toward the substrate 12, some collisions occur among the silicon and hydrogen atoms and the undecomposed $SiH_4$ gas molecules due to normal Brownian movements. A few of these collisions were found to be necessary, according to this invention, to produce a good, device quality, hydrogenated amorphous silicon film. As will be explained below, certain gas precursors must be reacted away in order to produce the device quality films, and the probability of this reaction occurring becomes higher as the number of gas phase collisions increases. However, too few collisions and too many collisions are deleterious to the quality of the film. The number of atomic collisions is a function of the gas pressure in chamber 10 and of the distance L between the filament 16 and the substrate 12, so those parameters have to be controlled carefully. It has been found, according to this invention, that, when using concentrated silane, a pressure in the range of about 5 to 50 millitorr (preferably about 30 millitorr) and a distance between the filament 16 and substrate 12 in the range of about 0.5 to 2.0 cm (preferably about 1.0 or 1.5 cm) produces the a-Si:H film with excellent electrical characteristics and stability at exceptionally high deposition rates in the range of about 50 Å/sec or more in the vicinity immediately adjacent the hot wire filament 16. On portions of the substrate 12 that are farther away from the hot wire filament 16, the deposition rate is less, of course, but is still observed to be at least 15 Å/sec on areas of the substrate that are remote from the hot wire filament. In order to coat uniformly a large area substrate 12 with device quality a-Si:H film, an array of equally spaced filaments 16 separated from each other by a distance M that is about the same as the filament to substrate gap L, as illustrated in FIG. 9, is preferred. For such an array, the product of gap L times pressure P (P×L) will typically be slightly larger than the single filament value of 30 millitorr-cm. At this preferred pressure times gap product value, an average number of about 10 atomic collisions between the atomic species (Si, H) and the silicohydride gas occurs as the atoms migrate from the filament 16 to the substrate 12. As mentioned above, this relationship produces the best results for high rate deposition of device quality a-Si:H, since it ensures that almost all of the Si atoms react with silicohydride gas molecules before reaching the film while avoiding excessive numbers of deleterious radical—radical collisions that will occur at larger values of the pressure times gap or distance (P×L) product.

Figure 2:
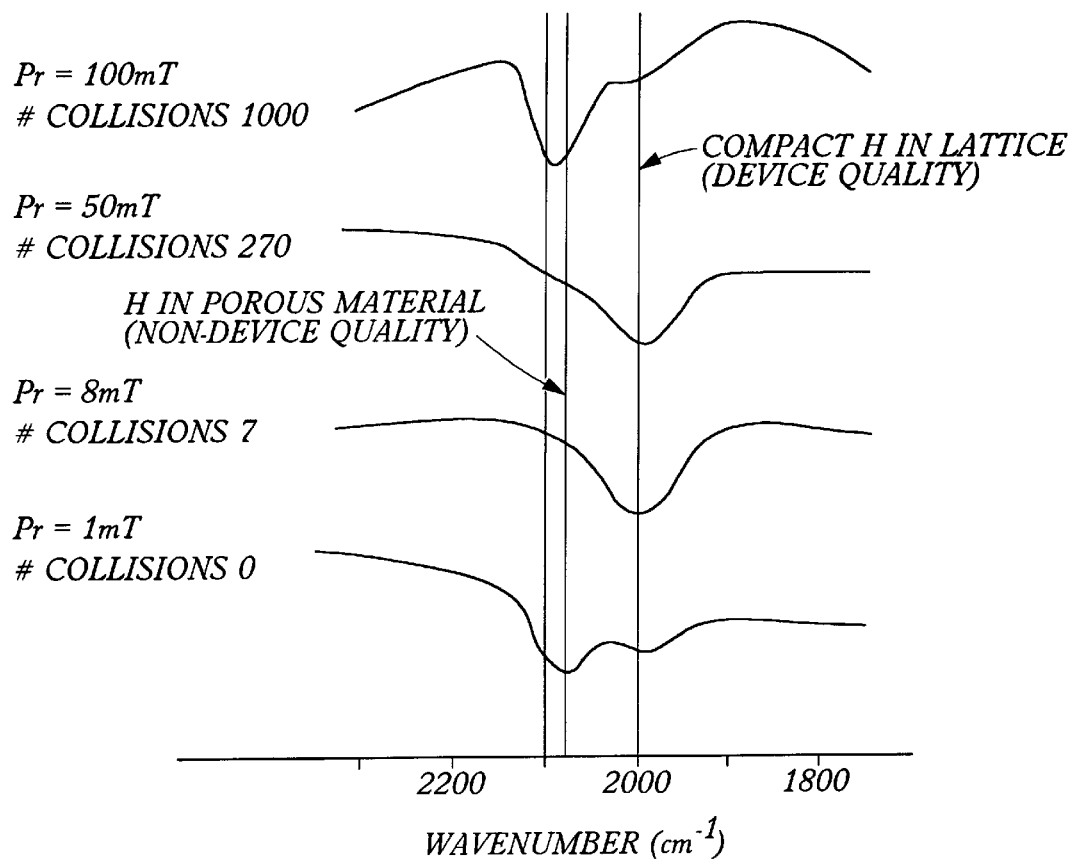
FIG. 2 is a graph that shows the type of Si-H bonding versus the approximate number of collisions the atomic species evaporated from the 2000° C. filament undergo as they traverse the filament to substrate distance in the deposition chamber and illustrates the parameters that produce device quality a-Si:H according to this invention.

The graphs in FIG. 2 show infrared absorption data illustrating the types of Si-H bonding occurring in an a-Si:H film versus the approximate number of gas collisions that the atomic species evaporated from 2000° C. filament undergo as they traverse the filament-substrate distance in the deposition chamber. The graphs are offset vertically to show differences in curve shapes. It is known in the field that a dip in the transmission curve between 1950 and 2050 $cm^{-1}$ and centered in the neighborhood of 2000 wave numbers is the signature of H bonded in the monohydride, or SiH mode. This characteristic is indicative of H bonded in a compact Si lattice, and it is observed traditionally in device quality a-Si:H. It is also known that a dip in the transmission curve in the 2015–2150 $cm^{-1}$ region and centered in the neighborhood of 2070–2100 wave numbers can be the signature of H bonded polyhydride, or $(SiH_2)_n$ mode, which is indicative of H bonded in a porous lattice and is observed traditionally in non-device quality a-Si:H. As can be seen in FIG. 2, when the number of collisions is either too few or too many, the polyhydride signature is clearly evident. It is only when the number of collisions are limited, i.e., in the neighborhood of 10 as discussed in this invention, that device quality a-Si:H is produced.

A good indication of the material quality is the ratio R', where:

$$R' = \frac{(SiH_2)_n}{(SiH)} \quad (1)$$

and $(SiH_2)_n$ and (SiH) refer to the amount of film absorption in the infrared modes centered at approximately 2070 $cm^{-1}$ and 2000 $cm^{-1}$ respectively. The lower the ratio R', the more dense and superior the electrical characteristics will be and the film will be more stable.

While it is not entirely clear at this point exactly why these pressure and distance parameters produce the best device quality hydrogenated amorphous silicon films, it is now believed that the number of atomic collisions that the pure atomic species undergo in the gas phase is important in the sense that the probability that these atomic species will react with the unreacted silane molecules, thus change their form, increases with the number of atomic collisions. More specifically, when silane ($SiH_4$) molecules reach the hot filament 16, they disassociate into either free atomic species such as silicon (Si) atoms and free hydrogen (H) atoms or some variation, for example, including hydrogen gas molecules ($H_2$). The free silicon (Si) atoms which evaporate from the filament 16 have four unsatisfied bonds, thus are very reactive. If they reach the substrate in that reactive form, they will stick to the growing film wherever they land rather than diffusing around the surface to find the best sites for lowest energy positions before bonding. As a result, such free Si atomic species that reach the substrate would contribute toward the production of more porous films that have less desirable structures and poor electronic properties. The specie $SiH_3$, however, has only one unreacted bond and is thus far less reactive. This less reactive species, upon reaching the substrate, is more mobile and free to move around on the growing film surface to find the most desirable, lowest energy sites before bonding. The result is a film with better structure, fewer dangling bonds, and better electrical properties. Therefore, if the Si atomic species that are evaporated from the hot filament 16 can be prevented from reaching the substrate or growing film, thus allowing the a-Si:H film to be grown from less reactive species, such as $SiH_3$, the resulting structure and electronic properties of the a-Si:H film will be much better.

Consequently, it is important, according to this invention, to create processing conditions that minimize the probability of free Si atoms from reaching the substrate 12 or the growing film surface in favor of less reactive species, such as $SiH_3$. Such processing conditions are created, according to this invention, by providing parameters that encourage an optimum probability of reacting away free Si atomic species evaporated from the hot wire filament 16 before they reach the substrate 12 or growing film surface as well as by reacting free H atoms evaporated from the hot wire filament 16 with silane ($SiH_4$) molecules to produce some of the less reactive species, such as $SiH_3$. All of the possible reactions are not known or understood completely, but, for example, a free Si atom might react with a $SiH_4$ molecule to produce two $SiH_2$ molecules or a $SiH_3$ molecule and a SiH molecule, the latter of which may possibly react with one or two hydrogen atoms to produce a $SiH_2$ molecule or a $SiH_3$ molecule. Similarly, a free H atom might react with a $SiH_4$ molecule to produce a $SiH_3$ molecule and a $H_2$ gas molecule. However, all of these and other possible reactions to eliminate free Si atoms and to produce the less reactive, thus more desirable, $SiH_3$ molecular species, require contacts, i.e., collisions, between the disassociated Si or H atomic species that are evaporated off the hot wire filament 16 and the unreacted $SiH_4$ molecules from the feed gas. There is not necessarily a reaction for every collision, but there is a probability that a collision will result in a reaction. The probability of a disassociated H atom reacting with an unreacted $SiH_4$ molecule upon collision is not 100 percent, but it is quite high, and it is greater than the probability that a disassociated Si atom will react with an unreacted $SiH_4$ molecule upon collision. Overall, therefore, the higher the collision rate, the more likely it will be that the disassociated Si atoms evaporated off the hot wire filament 16 will be reacted with $SiH_4$ molecules before reaching the growing film on the substrate 12. Therefore, the chamber pressure must be high enough to react away these Si atoms in the gas phase before they reach the growing film on the substrate 12.

On the other hand, when the chamber pressure is too high, the probability of radical—radical reactions increases above a negligible level. When the Si atoms react with the silicohydride gas, some radicals containing 2-Si-atoms are produced, while H atoms reacting with the silicohydride gas produces $SiH_3$. If these radical species react with reach other in the gas phase, their products react with the silicohydride gas to yield multiple-Si-atom species, or, as this reaction continues, the process ultimately produces very small microparticles. For example, but not for limitation, two of the $SiH_3$ radicals or species could react together to form $Si_2H_x$ radicals (X>3), which in turn react with two or more $SiH_4$ molecules to yield larger $Si_xH_m$ radicals, with X, M>3. This heavy molecule moves less rapidly out of the chamber, thereby allowing it to react further with radicals and enabling it to gain even more Si atoms. Ultimately, hundreds of thousands of Si atoms combine in a microparticle that can deposit into the growing film with undesirable consequences for both electrical properties and structural properties. There are, of course, many other possible and probable radical—radical reaction combinations and resulting large silicon-hydrogen molecules that lead to microparticles. If such microparticles become incorporated into the growing film, they also have a deleterious effect on the film structure and on the electronic properties of the film. Therefore, it is necessary for purposes of this invention to maintain a proper balance between too few collisions where too much Si reaches the growing film on the substrate 12 without reacting with the $SiH_4$ or other silicohydride feed gas and too many collisions where there are too many radical—radical reactions and microparticles forming.

Figure 3:
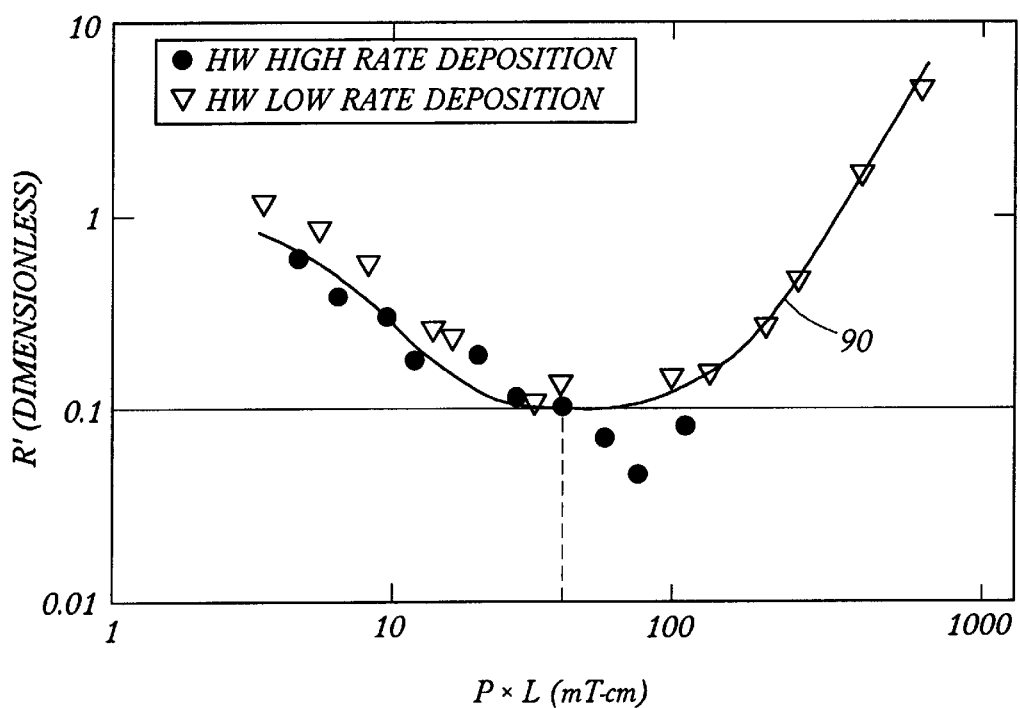
FIG. 3 is a graph of the infrared parameter R' versus the product of the chamber pressure (in millitorr) and the filament-to-substrate spacing (in cm)

Experiments have shown that about 30 millitorr pressure when using concentrated silane gas in combination with a spacing of about 1.5 cm between hot wire filament 16 and the substrate 12 will produce excellent device quality hydrogenated amorphous silicon films at rates up to at least 50 Å/sec. This result was achieved as a result of discovering the relationship between R' and the P×L product that is illustrated in FIG. 3. As discussed above, the ratio R' is indicative of the a-Si:H film material and electrical quality. A lower R' number indicates fewer "wrong" bonds, thus more dense material with superior electrical device characteristics. As shown by the curve 90 in FIG. 3, there is a low R' value that corresponds with a particular P×L product. The curve 90 illustrated in FIG. 3 is constructed from a composite of data points from films produced at low rates as well as by the high rate deposition described herein to illustrate a low R' of about 0.1 where the P×L product is about 45 mT-cm. The significance of discovering this relationship between R' and the P×L product is that for a desired filament-to-substrate spacing L, the optimum pressure P to produce a low ratio R', thus high quality film, can be determined. The result is that a high electric quality film can be produced, even at the high deposition rate of 50 Å/sec., by maintaining the pressure and the filament-to-substrate spacing within a relationship where the P×L product is in the range of about 10 to 100 mT-cm, preferably about 45 mT-cm. In the example described below, the 30 mT pressure times 1.5 cm filament-to-substrate spacing provides a P×L product of 45 mT-cm, which, as illustrated by the graph in FIG. 3, has a minimum R' value of about 0.1. A 1.0 cm filament-substrate spacing would require about 45 mT pressure according to this invention in order to maintain the P×L product at about 45 mT-cm where R' is at the minimum.

The fourth parameter, the substrate temperature, is also a controlling factor in the quantity of hydrogen finally incorporated into the hydrogenated amorphous silicon film. The typical relationship between substrate temperature and hydrogen content is that the higher the substrate temperature, the lower the hydrogen content of the hydrogenated amorphous silicon (a-Si:H) film. However, the film growth rate also influences the H content. Experiments that lead to the development of this invention indicate that for constant growth rate, the hydrogen H content decreases monotonically as the temperature of the substrate 12 increases, and for constant substrate temperature, increasing the growth rate increases the H content. Consequently, it has been found that, as used in this invention with the other parameters described above, the temperature of the substrate 12 should be maintained in the range of 200 to 600° C., and preferably at about 350–500° C., during the deposition process with the optimum value within that range depending on growth rate. Heating the substrate table or holder 18 to the temperature of about 400 to 600° C. actually results in slightly lower temperatures in the range of about 300 to 500° C. at the substrate surface due to the high vacuum, infrared radiation from the substrate surface, and other thermal conduction inhibitions.

One additional factor has been identified, which might contribute to allowing a superior a-Si:H film to be produced with such low H content according to this invention. As opposed to the glow discharge process, which involves very energetic electrons, neutral radical species and ions, the maximum kinetic energies obtainable in the process of the present invention are the thermal energies that the atomic species receive as they are evaporated off the substrate. In addition, since these species undergo several collisions in the gas phase, the energies of the mix of radical species in the deposition chamber is reduced even further. Therefore, at these low thermal energies, no ions or energetic electrons are produced in the gas phase. Since it is generally believed that film bombardment by energetic species damages the growing film surface, films grown by the present technique may avoid the effects of such bombardment.

It had generally been believed, prior to our invention described in our U.S. Pat. No. 5,397,737, that the "normal" hydrogen content of about 10–15 at. % in amorphous silicon films was needed to passive Si dangling bonds and reduce lattice strain in the amorphous silicon. The method of that invention, however, allowed the deposition of lower than "normal" hydrogen content hydrogenated amorphous silicon (a-Si:H) with reduced randomness of the deposited silicon, thus with reduced lattice strain between the silicon atoms within the film.

It has also been believed prior to this invention that the deposition of hydrogenated amorphous silicon at significantly higher rates, compared to rates used in prior art manufacturing processes, results in films that display increased amounts of "wrong bonded hydrogen," i.e., an increase in the ratio R', a deterioration in electronic properties, and an increase in the degradation of photovoltaic properties fabricated with such films upon exposure to sunlight. This degrading effect, as mentioned above, is called the Staebler-Wronski effect. The method of this invention, however, allows the deposition of hydrogenated amorphous silicon at significantly higher deposition rates in films that exhibit no increase in the amount of "wrong bonded hydrogen," a preservation of device quality electronic properties, and a Staebler-Wronski effect equal to or better than that exhibited by films that are deposited by the prior art glow discharge (GD) methods at significantly lower deposition rates.

EXAMPLE I

A sample of hydrogenated amorphous silicon film with very good electronic properties was made at a very high deposition rate—50 Å/sec—according to the high deposition rate method of this invention. To achieve this high deposition rate, pure silane gas ($SiH_4$) was flowed at the rate of about fifty atmospheric-pressure cubic centimeters per minute (50 SCCM) into the chamber, which was maintained at about a 30 mT pressure. The substrate 12 was positioned 1.5 cm from the filament 16. The 30 mT pressure and substrate-filament spacing ensured that the most of the Si evaporated from the hot filament 16 reacted with $SiH_4$ molecules before reaching the substrate 12 and provided a minimum in the R'-value (R'≈0.10) as determined from infrared (IR) spectroscopy. This R' value is equal to the lowest value measures in device quality films deposited by prior art techniques. The substrate surface temperature was estimated surface temperature was estimated to be about 425° C. based on external thermocouple temperature of about 500° C. The filament used was a 0.5 mm diameter, 10 cm long tungsten filament, which was heated with A.C. current of 14 amps to about 2,000° C. The deposition rate of this sample was 50 Å/sec. The hydrogen content of the resulting hydrogenated amorphous silicon film was measured to be about 8 at. %. After 600 hours of air mass 1.5 white light soaking, the ambipolar diffusion length, as measured by the steady state photo grating (SSPC) method, was about 1400 Å. The air mass 1.5 is indicative of the light spectrum used in the white light soaking.

Presented below is a comparison among: (i) a deposition of a low hydrogen content, hydrogenated amorphous silicon film produced according to the principles of the embodiment of the invention at it was described in the U.S. Pat. No. 5,397,737; (ii) a deposition of hydrogenated amorphous silicon film produced according to the high rate deposition method of this invention; and (iii) one produced by the more traditional glow discharge (GD) deposition process. The use of hot wire or filament to assist a vapor deposition, as in the current invention, is commonly referred to as a hot-wire-assisted chemical vapor deposition or hot wire (HW) deposition. It is to be understood that the examples given below are for illustrative purposes only, and are not intended to limit the scope of the invention as herein described or as set forth in the appended claims.

Some hot wire (HW) films were deposited previously using the method of the invention, as described in U.S. Pat. No. 5,397,737, using silane gas, a deposition chamber pressure of 8 millitorr, a filament-to-substrate spacing of about 5 cm, and a filament temperature of about 2,000° C. The substrate temperature, however, was varied to change the atomic percent of hydrogen contained within the various films. Each sample at a particular substrate temperature, and therefore particular atomic percent hydrogen content, was simultaneously deposited onto 7059 glass and crystalline silicon substrate. The deposition rates for these HW films, deposited according to the principles as described in the patent, were 5–10 Å/sec.

The glow discharge (GD) films were also previously deposited on the anode of a capacitively coupled, parallel plate, radio frequency deposition apparatus, which was operating at 13.65 MHz. The other operating conditions were selected to produce high quality, or device quality, hydrogenated amorphous silicon film. These conditions include a 70 mW/cm² discharge power, silane at a flow rate of 100 sccm, and a 500 millitorr chamber pressure. Similar to the HW films, several GD films were deposited over a range of substrate temperatures, and thus, hydrogen contents, simultaneously onto 7059 glass and crystalline silicon. The deposition rates for the GD films deposited were in the range of 1.5–2.5 Å/sec.

The hydrogen content of each of these previous samples were determined from the films deposited onto the crystalline silicon substrate by the magnitude of the absorption of the SiH 630 cm$^{-1}$ infrared mode. Film thickness for all samples were typically 1.5–2.5 μm, and Raman measurements showed all films to be amorphous.

Several measurements were taken on these previous HW and GD films in order to compare their electrical, chemical, and mechanical properties. These measurements included Urbach tail widths ($E_0$), Tauc's bandgaps ($E_g$), photoconductivity, dark conductivity, defect state density, and ambipolar diffusion lengths (SSPG).

Figure 4:
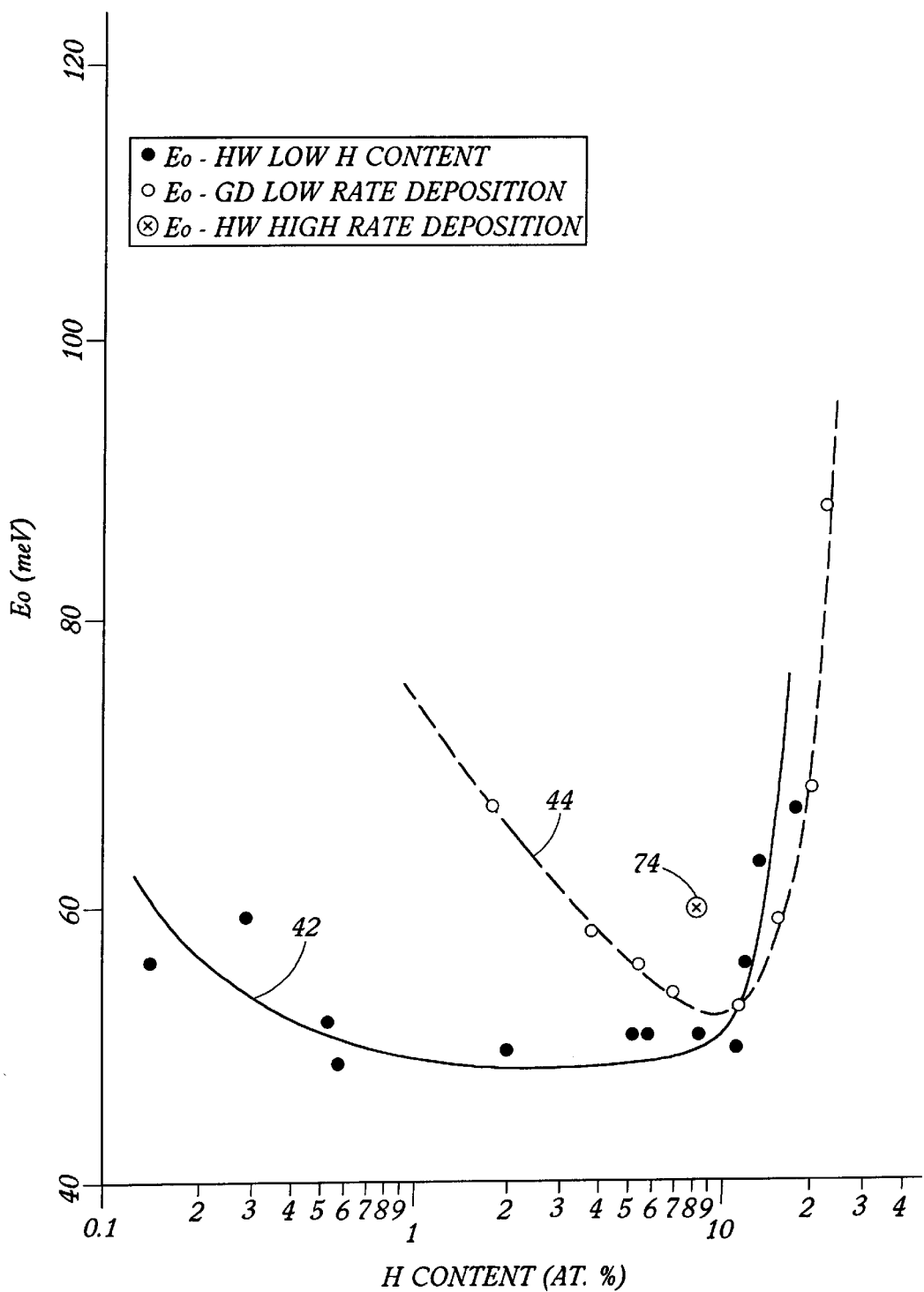
FIG. 4 is a graph of Urbach Tail width versus hydrogen content of a series of hydrogenated amorphous silicon (a-Si:H) films produced according to the principles of the present invention and a series of traditional glow discharge deposited a-Si:H films for comparison, as well as a data point representing results to date with the high deposition rate method according to this invention.

The Urbach tail widths ($E_0$), for the various hydrogen concentrations of the GD films and the HW films were determined by photothermal deflection spectroscopy. These measurements of Urbach tail widths millielectron volts (meV) are plotted in FIG. 4 against a logarithmic scale of hydrogen concentrations or "H content" in atomic percent, to show a wide range of data and to better emphasize the differences between GD and previous HW samples at low H content. The discrete data for the previous HW samples deposited according to the principles of the aspects of this invention that were described in our U.S. Pat. No. 5,397,737 are represented by the solid dots. The trends of this data are approximately by continuous line 42. Similarly, the discrete data for the previous GD samples are represented by the hollow dots and approximated by the continuous line 44. There are two regions of interest in the comparison of these two sets of samples. First, for that region above 10 at. % hydrogen, both the HW and GD samples display similar characteristics, in that the Urbach tail widths increase rapidly in this region. For that region below 10 at. % hydrogen, the GD films again show increasing Urbach tail widths. However, the previous HW films remain approximately at a 50 meV minimum until well below a hydrogen concentration of 1 at. %. This 50 meV value of Urbach tail width is typical of device quality films. Therefore, the graphic representation in FIG. 4 illustrates that the HW film with substantially lower H content (1 at. %) according to the invention described in U.S. Pat. No. 5,397,737 is of comparable device quality to the more conventional GD films having "normal" content (10–15 at. %). Yet, as described in the U.S. Pat. No. 5,397,737, the HW film according to that low hydrogen content embodiment of the invention is less susceptible to Staebler-Wronski effect degradation, which it was postulated, was because of its much lower H content.

It is important to note that it was impossible, in making the films, to lower the H content of the GD films below the values of 2–3 at. %, and thus enable a comparison with the low H constant HW films, without the GD films becoming microcrystalline.

The data point 74 on FIG. 4 represents the Urbach tail width of about 60 meV at the 8 at. % hydrogen content of the sample produced according to the high rate deposition method of the present invention. This 60 meV Urbach tail width is very respectable for device quality films.

Figure 5:
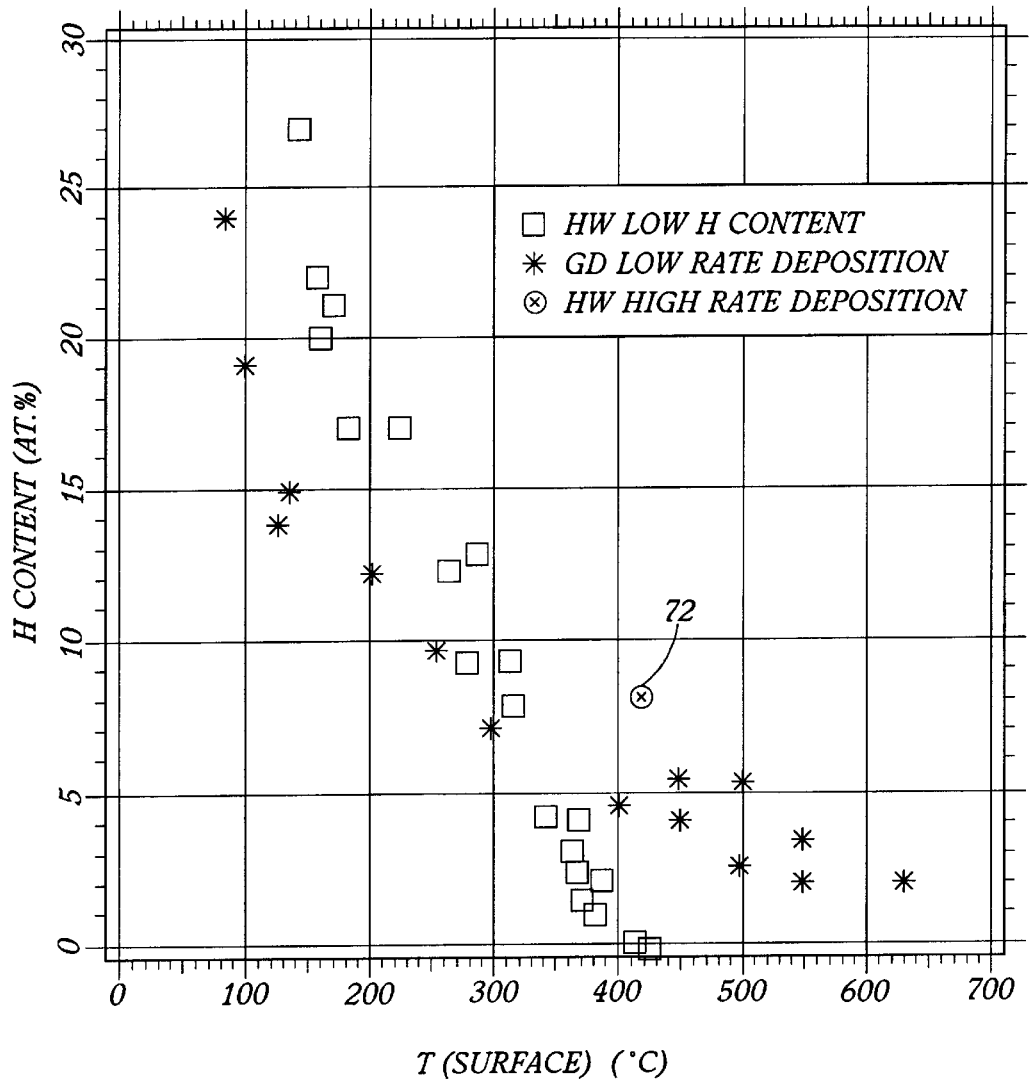
FIG. 5 is a graph of the H content of the respective hot wire and glow discharge films plotted as a function of the surface temperature of the growing film, indicating possible differences in how the H is bonded in the two series of films, as well as a data point representing results to date with the high deposition rate method according to this invention.

FIG. 5 shows a graph of the H contents of the respective films as a function of the surface temperature of the growing film. For hydrogen contents less than about 10 at. %, the predominant mode of binding was in the SiH, or monohydride, mode (See FIG. 2) for both sets of previously deposited HW and GD deposited films as well as for the Example I film deposited by the high rate deposition method of this invention. However, for temperatures in excess of 400° C., almost all the H is removed from the previously reported HW films, while a significant amount of H still remains incorporated in the previously deposited GD films. These data were thought to suggest basic differences in how the H in the monohydride mode is bonded in the two sets of previous HW and GD deposited films as the substrate temperature is increased and possibly to explain in part the differences in the structural, electronic, and light soaking properties observed between the low H content HW and GD films. The higher hydrogen content (about 8 at. %) of the film deposited by the high rate deposition process at the approximately 425° C. substrate surface temperature of the present invention, as described in Example I and illustrated by data point 72 in FIG. 5, suggests that there is not as much time for the hydrogen in the growing film to out diffuse at the high deposition rates of this method. If lower hydrogen content is desired or needed, such as to reduce Staebler-Wronski effect degradation further on exposure to sunlight, higher substrate surface temperature may be useful to reduce hydrogen content while still maintaining high deposition rates. However, additional data would have to be obtained to establish this result. It is very significant that, in spite of the 8 at. % H content, the sample of Example I has excellent electronic characteristics and only minimal Staebler-Wronski effect degradation. Therefore, the 8 at. % hydrogen content of films produced by the high rate deposition method of this invention appears to be acceptable for use in solar cell devices.

Figure 6:
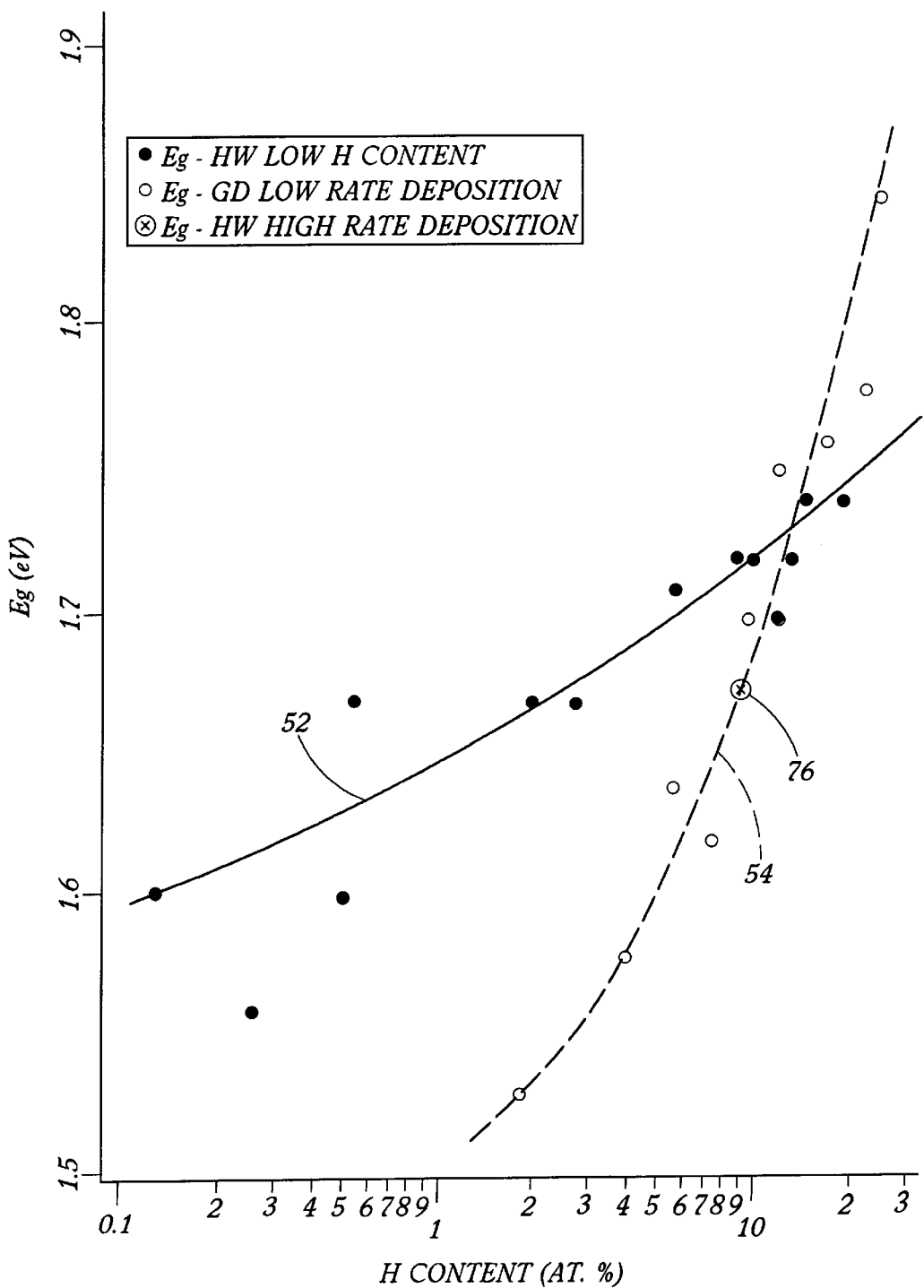
FIG. 6 is a graph of Tauc's Bandgap versus hydrogen content of the same series of hydrogenated amorphous silicon films produced according to the principles of the present invention and the same series of traditional glow discharge deposited hydrogenated amorphous silicon films for comparison, as well as a data point representing results to date with the high deposition rate method according to this invention.

The measured values of the Tauc's bandgaps ($E_g$), in electron volts, for the two sets of previous HW and GD deposited samples are plotted in FIG. 6, once again against a logarithmic scale of hydrogen content in atomic percent. As with the prior graph in FIG. 4, the solid dots represent the discrete HW data and the hollow dots represent the discrete GD data. This HW data is approximated by continuous line 52 and the PECVD data is approximated by continuous line 54. Both show the traditional linear dependence of bandgap ($E_g$) and at. % hydrogen. However, the previously deposited HW films produced in accordance with the principles of the invention described in U.S. Pat. No. 5,397,737, showed a more flattened linear relationship, which is indicative of film with greater integrity and less dependence on the number of hydrogen bonds. The data point 76 in FIG. 6 shows that the bandgap of about 1.67 eV for the 8 at. % hydrogen concentration of the Example I film produced by the high deposition rate of the present invention is slightly less than the HW samples deposited previously, but is still very comparable to the bandgaps of the previous GD deposited films having similar hydrogen content.

Figure 7:
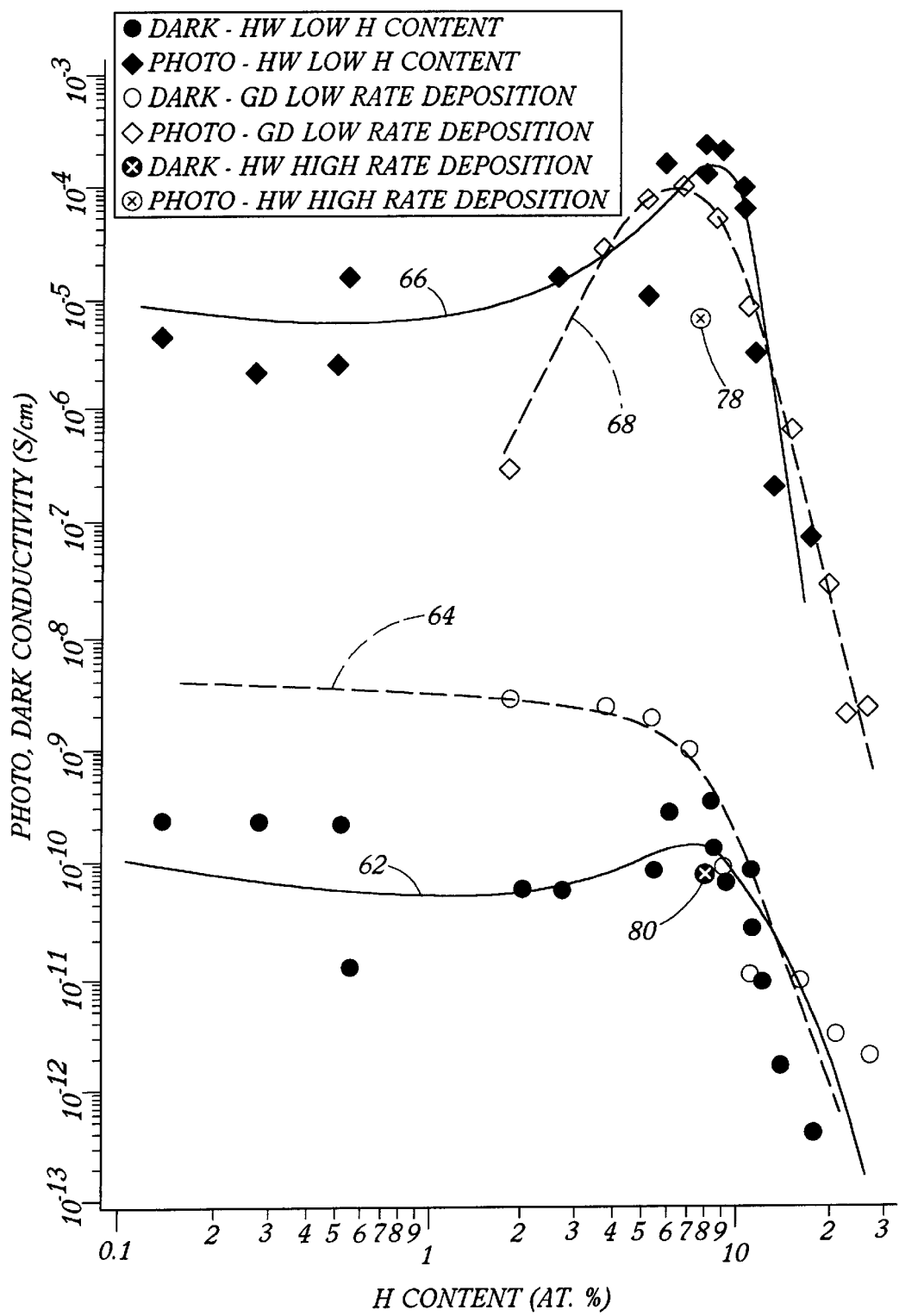
FIG. 7 is a graph of Photo and Dark Conductivity versus hydrogen content of the hydrogenated amorphous silicon films produced according to the principles of the present invention and the traditional glow discharge deposited hydrogenated amorphous silicon films for comparison, as well as a data points representing results to date with the high deposition rate method according to this invention.

The Photo and Dark Conductivity, expressed in Siemens per centimeter (S/cm), for both the previous HW and GD deposited sets are plotted on the same graph, in FIG. 7, against a logarithmic scale of hydrogen content in at. %. Once again in HW data for the previous HD deposited films are the solid discrete points, which, in this case are circular dots for the Dark Conductivity and diamond shapes for the Photoconductivity. Similarly, the hollow circular dots represent the Dark Conductivity for the previous GD deposited film samples, and the hollow diamonds represent the Photoconductivity for the previous GD deposited films. Line 62 approximates the Dark Conductivity for the previous HW deposited films, and line 64 approximates the Dark Conductivity for the previous GD deposited films. Line 66 represents an approximation of the Photo-conductivity of the previous HW deposited film samples, and line 68 the Photo-conductivity of the previous GD deposited film samples.

In that region above a hydrogen at 10 at. %, both sets of data in FIG. 7 show a similar characteristic rapidly decreasing conductivity for both Photo and Dark Conductivity for increasing at. % H. However, for that region below a hydrogen concentration of 10 at. % hydrogen, including 1 at. % hydrogen and below, the films of the previous HW deposited samples show much higher levels of Photoconductivity and lower levels of Dark Conductivity, both of which are marked improvements over the GD films. Note that the only way of reaching H contents less than 1 at. % for the GD films is to take a film previously deposited at a lower substrate temperature (e.g., 290° C.) and anneal it in vacuum to drive out the bonded H. When this is done, enabling H contents in the range 1.0–0.5 at. % to be produced, the ratio of photo or light to dark conductivity for the GD films is on the order of 2–3, while the photo or light to dark conductivity ratio for a grown HW films of comparable H contents is on the order of $10^4$. This result again illustrates the superior electronic nature of the low H constant HW films.

The Dark Conductivity of the Example I film produced according to the high deposition rate method of the present invention, as shown by data point 80 in FIG. 7, is very similar to the Dark Conductivity of the previous HW deposited films at comparable hydrogen content and slightly less than the GD deposited films of comparable hydrogen content, which is very good. The Photoconductivity of the Example I sample produced by the high deposition rate method of this invention, as shown by data point 78 in FIG. 7, is slightly less than, but still very much in the desirable range and quite comparable to the Photoconductivity of the previous HW and GD deposited films.

The ambipolar diffusion lengths for these samples were measured by the steady state photo grating (SSPG) technique. The previous HW deposited films gave values for the ambipolar diffusion lengths as high as 2000 Å for the films with low hydrogen concentrations, which are greater than those values observed for device quality GD hydrogenated amorphous silicon films (about 1500 Å) containing "normal" (10–15 at. %) hydrogen contents. The ambipolar diffusion length of the Example I sample produced by the high deposition rate method of the present invention after 600 hours of AMI light soaking is about 1400 Å. This result is significant, because the SSPG values of GD films in the light soaked state are typically much less—1000 Å. Therefore, this comparison is another indication of the improved stability of the a-Si:H films produced by this hot wire technique of this invention, even when deposited at the high rate of about 50 Å/sec.

In summary, the data shows that for a hydrogenated amorphous silicon (a-Si:H) film deposited with concentrated silane according to the principles of the invention described in U.S. Pat. No. 5,397,737, with a hydrogen content as low as 1 at. %, the photoconductivity is between 1 and $2 \times 10^{-5}$ s/cm, the light to dark conductivity ratio is greater than $10^5$, the Urbach tail width is 50 meV, the bandgap is 1.67 eV, and the "as grown" ambipolar diffusion length is as high as 2000 Å. All of these data are indicative of device quality electronic performance. For the Example I film produced by the high deposition rate HW method of the present invention, the photoconductivity is about $1 \times 10^{-5}$ s/cm, the light to dark conductivity ratio is about $10^5$, the urbach tail width is about 60 meV, the bandgap is about 1.67 eV, and the ambipolar diffusion length after light soaking is about 1400 Å, all of which are also indicative of excellent device quality electronic performance.

Figure 8:
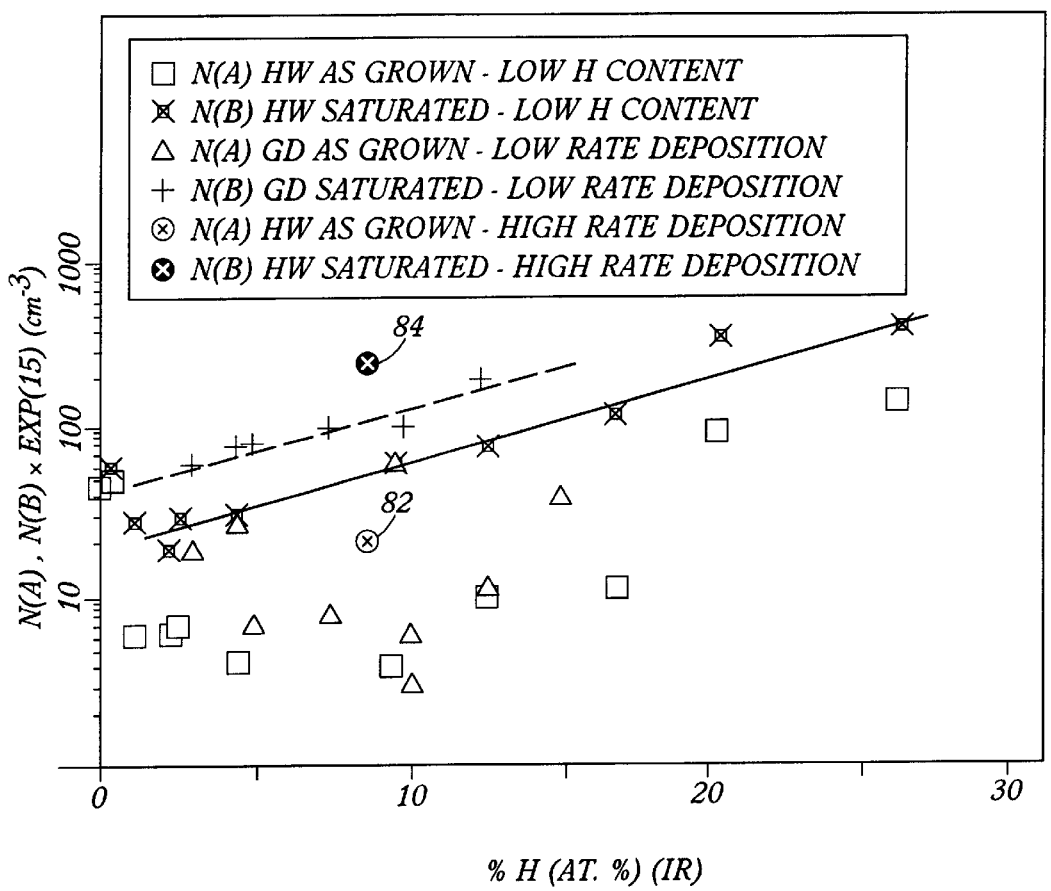
FIG. 8 is a graph comparing midgap defect density values for hot wire and glow discharge samples as grown and light soaked versus hydrogen concentration, as well as a data point representing results to date with the high deposition rate method according to this invention.

Finally, in FIG. 8, we show values of the midgap defect density for selected previous HW and GD deposited films, plotted versus a linear scale of hydrogen concentration in at. %, in the samples (N(A)) as grown, and also for samples (N(B)) when they are light soaked to saturation in a way such that no further increase in midgap state density is observed to occur upon additional light soaking. A linear scale of H concentration was chosen here, because no light soaking comparisons were made for samples containing H contents<1 at. %. The important point illustrated in FIG. 8 is that the saturated defect densities for the previous HW deposited films are consistently lower than those for the GD samples containing comparable H contents, and the saturated values for the HW samples containing low H contents (1–4 at. %) are lower than the values for state of the art GD samples deposited at substrate temperatures of 250° C. and containing approximately 10 at. % H. This data supports the observation that degradation of photoelectric cells upon exposure to sunlight can be reduced when the low H content a-Si:H material, which is the subject of the aspects of the invention that are described in our U.S. Pat. No. 5,397,737, is incorporated into such a cell.

The as-grown midgap defect density of the Example I film produced according to the high deposition rate HW method of this invention, as indicated by the data point 82 in FIG. 8, is slightly higher than the as-grown midgap defect densities of both the previous HW and GD deposited films for comparable hydrogen concentrations. Likewise, the saturated defect density of the Example I film, as shown by the data point 84 in FIG. 8, is slightly higher than the saturated defect densities of both the previous HW and GD deposited films for comparable hydrogen concentrations. However, considering that the Example I film was deposited at the rate of about 50 Å/sec, compared to 5–10 Å/sec. for the previous HW deposited samples and 1.5–2.5 Å/sec. for the GD deposited samples, these as-grown and saturated midgap defect densities are considered to be very good. Also, it is worth noting that the Staebler-Wronski effect degradation of the Example I film with its 8 at. % hydrogen concentration is not substantially different from the Staebler-Wronski effect degradation of the previous GD sample that was even deposited at the much lower deposition rates, which as explained above, has been considered necessary to achieve device quality electrical characteristics and to avoid adverse Staebler-Wronski effect degradation. This comparison indicates that the Staebler-Wronski effect degradation of photoelectric cells produced by the high deposition rate hot wire (HW) method of the present invention will not be substantially different from the Staebler-Wronski effect degradation of the other state of the art a-Si:H photoelectric cells, and may in fact be better.

Further, the fact that the Staebler-Wronski effect of the HW films with only about 1 at. % H, according to the aspect of the invention that is described in U.S. Pat. No. 5,397,737, is lower than the standard GD deposited films in addition to a similar relationship between the film represented by Example I as compared with GD deposited films that are fabricated at high deposition rates, might indicate that something in the HW deposition methods of both this invention and the U.S. Pat. No. 5,397,737 invention other than, or perhaps in addition to, the low hydrogen content contributes to diminution of the Staebler-Wronski effect degradation upon exposure to sun light. For example, perhaps the higher substrate temperatures used, in addition to increasing hydrogen out-diffusion during film growth, thus lowering hydrogen content of the resulting film, might also contribute to better orienting of the deposited material structure in a manner that reduces Staebler-Wronski effect degradation. However, if Staebler-Wronski effect improvement is needed in these high deposition rate, HW produced films and if it is confirmed that lower hydrogen content does contribute to decreasing Staebler-Wronski effect degradation, then, as mentioned above, higher substrate temperature during the HW deposition might be useful to achieve a lower hydrogen content along with the high deposition rates that are possible according to this invention.

Accordingly, a process has been provided which demonstrates high rate, large area deposition of device quality, relatively low hydrogen content, hydrogenated amorphous silicon films, particularly when using concentrated silane. Hydrogenated amorphous silicon films produced at the high deposition rates according to this invention exhibit material integrity and stability, while still demonstrating excellent electrical, chemical, and structural properties, and they are not as subject to Staebler-Wronski effect degradation as the conventional device quality films that have had to be produced with substantially higher hydrogen content to achieve device quality electronic characteristics.

It is possible, based on observations and information learned from this invention, that even closer spacing of the substrate to the filament in combination with even higher pressures, such as perhaps 0.5 to 1.0 cm spacing with 40–60 mT pressure, will produce even higher deposition rates while retaining the good to excellent electronic properties achieved in the examples above. Again, the important criteria are that the filament temperature be high enough (about 2000° C.) to obtain complete decomposition of the impinging silicohydride gas, a combination of pressure and substrate to filament spacing that ensures that most of the Si evaporated from the filament can react with $SiH_4$ or other silicohydride molecules before reaching the substrate, and the substrate temperature be in a range (about 200–600° C.) that balances out-diffusion of hydrogen with time need for hydrogen to migrate to preferred bonding sites in view of the high rate at which Si and hydrogen arrive and bond at the substrate.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to falling within the scope of the invention as defined by the claims which follows.

What is claimed is:

1. A method of producing device quality, hydrogenated amorphous silicon on a substrate at a deposition rate of at least 50 Å/sec, comprising the steps of:

flowing silicohydride gas into contact with a filament that is at a temperature in a range of about 1,500° C. to 2,000° C., while (i) maintaining the silicohydride gas at a pressure P in a range of about 10 millitorr to 100 millitorr with the substrate positioned at a distance L from the filament in a range of about 0.5 cm. to 3.0 cm. that produces a pressure times distance (P×L) product in a range of about 10 millitorr-cm. to 100 millitorr-cm.; and (ii) maintaining the substrate with a surface temperature in a range of about 200° C. to 600° C.

2. The method of claim 1, including the step of maintaining the silicohydride gas at a pressure P in a range of about 10 millitorr to 100 millitorr with the substrate positioned at a distance L from the filament in a range of about 0.5 cm. to 3.0 cm. that produces at a pressure time distance (P×L) product of about 45 millitorr-cm.

3. The method of claim 1, including the step of maintaining the silicohydride gas at a pressure P in a range of about 10 millitorr to 100 millitorr with the substrate positioned at a distance L from the filament in range of about 0.5 cm. to 1.5 cm. that produces a pressure times distance (P×L) product in a range of about 10 millitorr-cm. to 100 millitorr-cm.

4. The method of claim 1, including the step of maintaining the silicohydride gas at a pressure P in a range of about 10 millitorr to 100 millitorr with the substrate positioned at a distance L from the filament in a range of about 0.5 cm. to 1.5 cm. that produces a pressure times distance (P×L) product of about 45 millitorr-cm.

5. A method of producing device quality, hydrogenated amorphous silicon on a substrate at a deposition rate of at least 50 Å/sec, comprising the steps of:

flowing silicohydride gas into contact with a filament that is at a temperature in a range of about 1,500° C. to 2000° C. while: (i) maintaining the silicohydride gas at a pressure of about 30 millitorr with the substrate positioned at a distance of about 1.5 cm. from the filament; and (ii) maintaining the substrate with a surface temperature in a range of about 200° C. to 600° C.

6. The method of claim 5, wherein said filament temperature is about 2000° C.

7. The method of claim 6, wherein said surface temperature is about 425° C.

8. A method of producing device quality, hydrogenated amorphous silicon on a substrate at a deposition rate of at least 50 Å/sec, comprising the steps of:

positioning the substrate in a deposition chamber at a distance in a range of about 0.5 cm. to 3.0 cm. from a heatable filament in the deposition chamber;

heating the filament to a temperature in a range of about 1,500° C. to 2,000° C. and heating the substrate to a surface temperature in a range of about 200° C. to 600° C.; and flowing silicohydride gas into the deposition chamber containing said filament and said substrate to decompose said silicohydride gas on said filament into silicon and hydrogen atomic species and allowing products of gas reactions between said atomic species and the silicohydride gas to migrate to and deposit on said substrate by maintaining a pressure in said deposition chamber that meets both criteria of (i) being in a range of about 10 millitorr to 100 millitorr and (ii) providing a pressure times substrate-filament spacing product in a range of about 10 millitorr-cm. to 100 millitorr-cm.

9. The method of claim 8, including the step of providing a pressure times substrate-filament spacing product at about 45 millitorr-cm.

10. The method of claim 8, including the step of positioning the substrate in the deposition chamber at a distance in the range of about 0.5 cm. to 1.5 cm.

11. The method of claim 10, including the step of positioning the substrate in the deposition chamber at a distance of about 1.5 cm.

12. The method of claim 8, including the step of maintaining the pressure in the deposition chamber at about 30 millitorr.

13. The method of claim 8, including the step of positioning the substrate in a deposition chamber with a plurality of heatable filaments such that the substrate is about the same distance from each heatable filament and the heatable filaments are spaced apart by about the same distance.

14. A method of producing device quality, hydrogenated amorphous silicon on a substrate at a deposition rate of at least 50 Å/sec, comprising the steps of:

flowing silicohydride gas into contact with a filament that is at a temperature in a range of about 1,500° C. to 2,000° C. to disassociate the silicohydride gas into free silicon atomic species and free hydrogen atomic species, while: (i) maintaining the silicohydride gas at a sufficient pressure P with the substrate positioned at a distance L from the filament in a range of about 0.5 cm. to 3.0 cm. to provide a pressure times substrate-filament spacing product in a range of about 10 millitorr-cm to 100 millitorr-cm, to react substantially all of the free silicon atomic species with hydrogen before such free silicon atomic species reach the substrate; and (ii) maintaining the substrate with a surface temperature of about 200° C. to 600° C.

15. The method of claim 14, including the step of maintaining the silicohydride gas at a pressure P sufficient to produce statistically about 3 to 50 atomic collisions among the silicon and hydrogen atomic species in said distance L to react the free silicon atomic species with the free hydrogen atomic species to produce less reactive $SiH_3$ molecular species prior to impact on the substrate.

16. The method of claim 15, including the step of maintaining the silicohydride gas at a pressure P with said distance L that produces a pressure times distance (P×L) product in a range of about 10 millitorr-cm. to 100 millitorr-cm.

* * * * *